United States Patent
Zhuk et al.

(10) Patent No.: US 8,043,692 B2
(45) Date of Patent: Oct. 25, 2011

(54) ALLOYED TUNGSTEN PRODUCED BY CHEMICAL VAPOUR DEPOSITION

(75) Inventors: Yuri Zhuk, Witney (GB); Yury Lakhotkin, Moscow (RU); Sergey Aleksandrov, Kidlington (GB)

(73) Assignee: Hardide Coatings Limited, Oxfordshire (GB)

( * ) Notice: Subject to any disclaimer, the term of this patent is extended or adjusted under 35 U.S.C. 154(b) by 514 days.

(21) Appl. No.: 11/665,187

(22) PCT Filed: Oct. 11, 2005

(86) PCT No.: PCT/GB2005/003913
§ 371 (c)(1),
(2), (4) Date: Dec. 29, 2008

(87) PCT Pub. No.: WO2006/040545
PCT Pub. Date: Apr. 20, 2006

(65) Prior Publication Data
US 2009/0117372 A1  May 7, 2009

(30) Foreign Application Priority Data

Oct. 12, 2004  (GB) .................................. 0422608.0

(51) Int. Cl.
*B32B 9/00* (2006.01)
*C23C 16/32* (2006.01)
(52) U.S. Cl. ......... 428/216; 51/307; 51/309; 427/255.1; 427/255.2; 428/336; 428/469; 428/472; 428/698
(58) Field of Classification Search .............. 51/307, 51/309; 428/216, 336, 469, 472, 698; 427/255.1, 427/255.2, 255.7
See application file for complete search history.

(56) References Cited

U.S. PATENT DOCUMENTS

| | | | |
|---|---|---|---|
| 3,361,599 A | | 1/1968 | Bargainnier et al. |
| 3,565,676 A | | 2/1971 | Holzl |
| 4,053,306 A | | 10/1977 | Rodriguez |
| 4,427,445 A | | 1/1984 | Holzl et al. |
| 4,910,091 A | * | 3/1990 | Garg et al. .................... 428/665 |
| 4,927,713 A | * | 5/1990 | Garg et al. .................... 428/627 |
| 4,980,201 A | * | 12/1990 | Tokunaga et al. ........ 427/249.18 |
| 5,028,756 A | | 7/1991 | Ezaki et al. |

(Continued)

FOREIGN PATENT DOCUMENTS

CN  1289859  4/2001

(Continued)

OTHER PUBLICATIONS

International Preliminary Report Application No. PCT/GB2005/003913 Apr. 20, 2006.

(Continued)

*Primary Examiner* — Archene Turner
(74) *Attorney, Agent, or Firm* — Pearl Cohen Zedek Latzer, LLP

(57) ABSTRACT

A wear-, erosion- and chemically-resistant material containing tungsten alloyed with carbon, the carbon being present in an amount of 0.01 wt % up to 0.97 wt % of the total weight, wherein the material preferably comprises a matrix of metallic tungsten with dispersed tungsten carbide nanoparticles having a particle size not greater than 50 nanometers, preferably not greater than 10 nanometers. The material is optionally also alloyed with fluorine, the fluorine being present in an amount of 0.01 wt % up to 0.4 wt % of the total weight. The material is extremely hard and tough.

37 Claims, 7 Drawing Sheets

U.S. PATENT DOCUMENTS

| | | | |
|---|---|---|---|
| 5,041,041 A | | 8/1991 | Passmore et al. |
| 5,064,728 A | * | 11/1991 | Sunder et al. ............ 428/627 |
| 5,372,661 A | | 12/1994 | Felix et al. |
| 5,512,240 A | | 4/1996 | Matusda et al. |
| 5,722,036 A | | 2/1998 | Shikata et al. |
| 5,742,891 A | | 4/1998 | Patrician et al. |
| 6,624,557 B2 | | 9/2003 | Pyen et al. |
| 6,800,383 B1 | * | 10/2004 | Lakhotkin et al. ............ 428/698 |
| 7,022,403 B1 | * | 4/2006 | Lakhotkin et al. ............ 428/216 |
| 2003/0132707 A1 | | 7/2003 | Meszaros et al. |

FOREIGN PATENT DOCUMENTS

| | | | |
|---|---|---|---|
| DE | 1160638 | | 1/1964 |
| EP | 0411646 | | 2/1991 |
| EP | 1158070 | | 11/2001 |
| EP | 1300380 | | 4/2003 |
| GB | 133168 | | 10/1919 |
| GB | 221786 | | 2/1925 |
| GB | 387699 | | 2/1933 |
| GB | 909946 | | 11/1962 |
| GB | 918620 | | 2/1963 |
| GB | 1051835 | | 12/1966 |
| GB | 1 540 718 | * | 2/1979 |
| JP | 54152281 | | 11/1979 |
| JP | 55024803 | | 2/1980 |
| JP | 55-070501 | * | 5/1980 |
| JP | 03-094060 | * | 4/1991 |
| JP | 06-173009 | * | 6/1994 |
| JP | 07300648 | | 11/1995 |
| JP | 5507051 | | 4/2003 |
| JP | 2003129164 | | 5/2003 |
| RU | 2206629 | | 6/2003 |

OTHER PUBLICATIONS

International Search Report Application No. PCT/GB2005/003913 Dated Apr. 20, 2006.

J.V. Festa & J.C Danko "Some Effects of Fluorine Content on the Properties of Chemically Vapor Deposited Tungsten" General Electric Company, Nuclear Thermionic Power Operation, 1967, p. 349-361.

Khusainov M.A; "Thermal Strength of Refractory Materials Produced by Chemical Vapour Deposition of Gaseous" Leningrad, Leningrad State University Publishing House, 1979, p. 160.

Lakhokin Y.V., Krasovsky A.I;"Tungsten-Rhenium Coatings", (in Russian), Moscow, Nauka, 1989, p. 159.

Savitsky E.M., Burkhanov G.S; "Metallurgy of Refractory and Rare Metals, (in Russian) Moscow, Nauka" Publishing House 1971, p. 356.

UK Search report Application No. GB 0422608.0 dated Feb. 22, 2005.

UK Search Report Application No. GB 0520589.3 Dated Feb. 22, 2006.

* cited by examiner

ALLOYED TUNGSTEN PRODUCED BY CHEMICAL VAPOUR DEPOSITION

CROSS-REFERENCE TO RELATED APPLICATIONS

This application is a national phase application of International Application PCT/GB2005/003913, filed Oct. 11, 2005, which in turn claims priority from UK application 0422608.0, filed on Oct. 12, 2004, each of which being incorporated by reference herein in its entirety.

FIELD OF THE INVENTION

This invention relates to a new and useful improvement in the composition of metal alloys having enhanced wear-, erosion- and chemical resistance and a combination of high hardness and toughness. In particular, the invention relates to enhanced tungsten alloyed carbon, preferably in the form of tungsten carbide nanoparticles, and optionally also with fluorine, produced from the gas phase by way of chemical vapour deposition (CVD).

BACKGROUND OF THE INVENTION

Alloyed tungsten is widely used as a refractory material and as a heat-resistant construction material, for example in the production of heavy alloys, filaments for incandescent lamps, and in electronics applications. Tungsten carbides are used in machine building, for the production of tools and heavy-loaded wear parts, in the form of a powder metallurgy composite consisting of tungsten monocarbide with cobalt or another metal binder. These materials have enhanced wears and erosion resistance and significantly prolong the life of tools and parts operating under harsh conditions.

Alloying of metals is a complex physical-chemical phenomenon of significant practical interest. For example, alloying of iron with various amounts of carbon under various conditions might change its mechanical and physical properties dramatically from mild iron, to low carbon steel, high carbon steel and pig iron. The properties of steel, first of all its hardness, significantly depend on the carbon content and the form in which carbon is present in steel (e.g. as free cementite $Fe_3C$ or alternatively as an interstitial solid solution of carbon in iron).

Alloying should be distinguished from inclusions or simple mechanical mixing of several materials. For example free carbon inclusions into iron can have a negative effect on its mechanical properties, whereas as alloying can improve its mechanical properties.

In several practical applications tungsten is alloyed by substitution impurities and chemical compounds to achieve specific properties. For example JP 2003129164 describes a heavy tungsten-based alloy with 0.1-3 wt % of nickel and copper which has a specific weight 18.5-19.2 g/cm³. RU 2206629 describes a powder-metallurgy alloy of tungsten with 0.6-0.8 wt % Co; 0.2-0.4 wt % Ta; 0.2-0.4 wt % Ni; 2.0-5.0 wt % Fe; 0.1-0.2 wt % La, which is recommended as a heavy alloy with specific weight 17.8-18.2 g/cm³ and which can be deformed up to 50-80%.

To increase the re-crystallisation temperature and vibration resistance of an incandescent filament, powder metallurgy tungsten wire is alloyed with aluminium, potassium, silicon and rhenium 0.05-1.19 wt % [US 2003132707], or lanthanum oxide 0.05-1.00 wt % [U.S. Pat. No. 5,742,891], aluminium, potassium, silicon and rhenium 0.2-0.4 wt % [U.S. Pat. No. 6,624,577], or to produce a duplex wire with a core of thorium oxide alloyed tungsten (W+ThO₂) and an external shell made of rhenium [U.S. Pat. No. 5,041,041].

Modern electrode materials used for arc welding require a combination of arc stability and arc-resistance, that according to U.S. Pat. No. 5,512,240 is achieved by alloying tungsten with lanthanum boride 0.02-1.0 wt %. U.S. Pat. No. 5,028,756 recommends, for electrode wire fox electro-erosion cutting, tungsten with Y, La, Ce, Pr, Nd, Pm, Sm, Eu, Gd, Tb, Dy, Ho, Er, Tm, Yb, Lu or with their oxides.

Tungsten alloys hold an important position among refractory construction materials. According to U.S. Pat. No. 5,372,661, an alloy consisting of tungsten, molybdenum and rhenium with up to 50 ppm of carbon added as a reducing agent has excellent erosion resistance, ductility, toughness and high re-crystallisation temperature. Transitional metals such as vanadium, chromium, manganese, iron, cobalt, nickel and rare earth metals are added to refractory materials, in particular to tungsten, to purify it from harmful additions of oxygen, nitrogen, carbon and hydrogen (U.S. Pat. No. 5,722,036).

This purification significantly improves the physical-chemical properties (corrosion-resistance, resistance to high temperatures, electrical conductivity) and technological properties (ductility, suitability for rolling or cutting).

In addition to the widely known hard metals based on tungsten monocarbide, U.S. Pat. No. 4,053,306 describes a composite material comprising tungsten carbide-steel, which has metallurgically-produced tungsten carbide particles 1-20 microns in size evenly distributed in the volume of carbon steel ox steel alloyed with nickel and cobalt.

In accordance with the aforementioned references, metallurgical tungsten is often alloyed for the purpose of purifying it from damaging admixtures and impurities. The admixtures and additives have a very low solubility in the tungsten matrix, and according to [Savitsky E. M., Burkhanov G. S. Metallurgy of Refractory and Rare Metals, (in Russian), Moscow, Nauka, 1971, p. 356] such solutions are possible with concentrations of up to 0.0001 wt %. Admixtures of higher concentration can strongly affect the mechanical properties of tungsten, for example excessive carbon could be most damaging by segregation on the grain boundaries, causing tungsten embrittlement.

All the aforementioned examples of alloying are related to metallurgical alloying, which involves either powder metallurgy or melting processes performed at high temperatures above 1200° C. Lakhokin Y. V., Krasovsky A. I.; Tungsten-Rhenium Coatings, (in Russian), Moscow, Nauka, 1989, p. 159 describes alloys of tungsten with rhenium produced by low-temperature CVD from the gas phase in a broad range of concentrations. As shown in this publication, the gas-phase alloying of tungsten with rhenium (up to 9 wt %) provides significant improvement of the mechanical properties of tungsten, simultaneously enhancing its strength and ductility.

Usually, tungsten produced from a mixture of tungsten hexafluoride and hydrogen contains up to 0.0015 wt % of hydrogen, 0.0042 wt % of oxygen, 0.0085 wt % of nitrogen, 0.0086 wt % of carbon and 0.012 wt % of metal impurities, and has a micro-hardness at the level of 490-520 kg/mm² (Khusainov M. A. Thermal strength of refractory materials produced by Chemical Vapour Deposition, Leningrad, Leningrad University Publishing, 1979, p. 160). By way of rectification of the tungsten hexafluoride, the content of the impurities in the tungsten can be reduced down to: 0.0012 wt % of oxygen, 0.0016 wt % of nitrogen, 0.0010 wt % of carbon and 0.0053 wt % of metal impurities, while the micro hardness can be reduced to 450-490 kg/mm². The authors of the above references tried to reduce the content of impurities to obtain plastic tungsten both by powder metallurgy and by chemical vapour deposition methods.

U.S. Pat. No. 4,427,445 describes a hard, fine-grained, internally stressed material of tungsten and carbon or tungsten, carbon and oxygen, which is produced by thermochemical deposition. The material consists primarily of a two phase mixture of pure tungsten and an A15 structure, the tungsten phase comprising between about 20% and 90% of the material, which has a hardness of greater than 1200 VHN, and an average grain size of less than 0.1 µm. A coating of this material is formed on graphite bars by heating these in a furnace and passing a gaseous mixture of tungsten hexafluoride, hydrogen and carbon- and oxygen-containing organic reagents (alcohols, ethers, ketones) over the bars. The 10-80% content of the A15 phase is easily detected by X-ray diffraction (XRD) analysis, the XRD spectrum containing lines both for metallic tungsten and the A15 structure. A typical XRD spectrum of such a structure is shown on FIG. 2 of the present application, in which the A15 structure is $W_3C$. The coating material has high compressive stresses (above 1000 MPa) and microhardness up to 2500 VHN.

To reduce hardness and relax internal stresses, U.S. Pat. No. 4,427,445 recommends additional heat treatment at temperatures between 600 and 700° C. so as at least partially to decompose or transform the A15 phase, thereby reducing hardness of the material to at least half of its pre-heat treated hardness. However, due to the differences in thermal expansion coefficients of the coating and the substrate material, the heat treatment applies additional stresses. At temperatures above 600° C. many materials lose their mechanical properties and the shapes and dimensions of work pieces can be distorted.

Various comparative tests described in EP 1 158 070 A1 (discussed below) show that a coating consisting of a mixture of metal tungsten and $W_3C$ shows worse wear-resistance as compared to other tungsten carbides WC and $W_2C$, as well as to a mixture of metal tungsten and $W_2C$. The use of oxygen-containing organic reagents results in the formation of tungsten oxyfluorides which are difficult to reduce with hydrogen. The presence of tungsten oxyfluorides results in a deterioration of the mechanical properties of the coatings.

EP 1158 070 A1 describes new compositions based on tungsten carbide alloyed with fluorine in a process of crystallisation from the gas phase. It is shown that the gas-phase chemical reactions between tungsten hexafluoride, propane and hydrogen at a substrate temperature of 400-900° C. and pressure 2-150 kPa crystallise a layer of tungsten carbide with a thickness of 0.5-300 microns. The carbon containing gas is activated by heating to 500-850° C. before its introduction into the reactor. The ratio between the carbon-containing gas and hydrogen is varied from 0.2 to 1.7 and the ratio between tungsten hexafluoride and hydrogen is varied from 0.02 up to 0.12. By variation of these process parameters, it is possible to obtain the following tungsten carbide compositions: WC+C, WC, WC+$W_2C$, $W_2C$, $W_2C$+$W_3C$, $W_2C$+$W_{12}C$, $W_2C$+$W_3C$+$W_{12}C$, $W_3C$, $W_3C$+$W_{12}C$, $W_{12}C$, WC+W, $W_2C$+W, $W_3C$+W, $W_{12}C$+W, $W_3C$+$W_{12}C$+W.

This method allows production of all single-phase tungsten carbides, their mixtures, as well as mixtures with carbon and with metal tungsten. It should be emphasised that this disclosure relates to compositions based on tungsten carbide as the main phase, with tungsten being an admixture impurity. This has been proved by X-ray diffraction analysis.

These tungsten carbide compositions have high hardness, up to 3500 kg/mm². The content of carbon in these coating materials can be up to 15 wt % and the content of fluorine up to 0.5 wt %. However, these materials are quite brittle like most other carbides, and cannot resist intensive load or an impact.

To reduce the brittleness of the carbide deposits, EP 1 158 070 proposes use of multi-layer deposits, consisting of alternating layers of tungsten and any of the tungsten carbides described above or their mixtures. The ratio of the thicknesses of the individual alternating layers can range from 1:1 up to 1:5.

Modern machine building requires materials which can resist harsh abrasive, erosive and corrosive environments and which have enhanced durability. Cemented or sintered carbide, also called hardmetal, is one of the most widely used types of wear-resistant materials.

Cemented carbide is a composite material consisting of tungsten monocarbide with a cobalt, or sometimes nickel or another metal, binder with a relatively low melting temperature. The binder content and composition can vary, as can the grain size of the tungsten carbide. This material can be produced by powder metallurgy sintering or alternatively by spraying, for example using plasma or high velocity oxy-fuel. The term "cemented carbide" will be used further in this text to describe this type of material. The particles of tungsten carbide give hardness, while cobalt gives toughness; as a result, this material shows excellent wear- and erosion-resistance. At the same time, however, cemented carbide has several drawbacks, in particular it is brittle, especially in thin-walled items or on sharp corners, and is expensive in manufacturing and machining, especially for items of complex shape. The cobalt binder can be attacked by corrosion.

SUMMARY OF THE INVENTION

According to various aspects of the present invention, there are provided materials, coatings and processes as set forth in the appended claims.

More specifically, according to a first aspect of the present invention, there is provided a wear-, erosion- and chemically-resistant material containing tungsten alloyed with carbon, the carbon being present in an amount of 0.01 wt % up to 0.97 wt % of the total weight.

Preferably, the material comprises a matrix of metallic tungsten with dispersed tungsten carbide nanoparticles having a particle size not greater than 50 nanometers, preferably not greater than 10 nanometers.

In some embodiments, it is important that all tungsten carbide nano-particles have a particle size or particle diameter not greater than 50 nm; in other embodiments, it is sufficient that a mean particle size or diameter of the tungsten carbide nanoparticles is not greater than 50 nm.

Preferably, the tungsten carbide nanoparticles may be either tungsten monocarbide WC, tungsten semicarbide $W_2C$, or a mixture of both.

The material is advantageously additionally alloyed with fluorine, the fluorine being present in an amount of 0.01 wt % up to 0.4 wt % of the total weight.

The material may have a micro-hardness from 700 Hv up to 2000 Hv, in some embodiments up to 2200 Hv Embodiments of the present invention relate to a new wear-resistant material based on a tough and ductile metal matrix consisting of tungsten strengthened by alloying carbon, especially in the form of tungsten carbide precipitates, and optionally also with compounds of tungsten with carbon and fluorine.

The material of embodiments of the present invention has been analysed using X-Ray Diffraction (XRD), which is widely used to analyse materials for both scientific and industrial applications. Different crystalline materials such as WC, tungsten and graphite have different XRD spectra defined by the inter-atomic distances in their crystalline lattices, and the XRD spectra can be used as a signature of the crystalline material. This technique enables the detection of crystalline materials present in amounts above 5% and having a particle size above 5 to 10 nm. Crystalline materials having a crystal size between 10 and 50 nm can be seen as broad humps at low diffraction angles, but if their content is below 5%, then their identification or even detection is not always possible and depends on the nature of the materials and their X-ray diffraction spectra.

BRIEF DESCRIPTION OF THE DRAWINGS

For a better understanding of the present invention and to show how it may be carried into effect, reference shall now be made by way of example to the following Examples and to the accompanying drawings, in which.

DETAILED DESCRIPTION OF THE INVENTION

Figure 1:
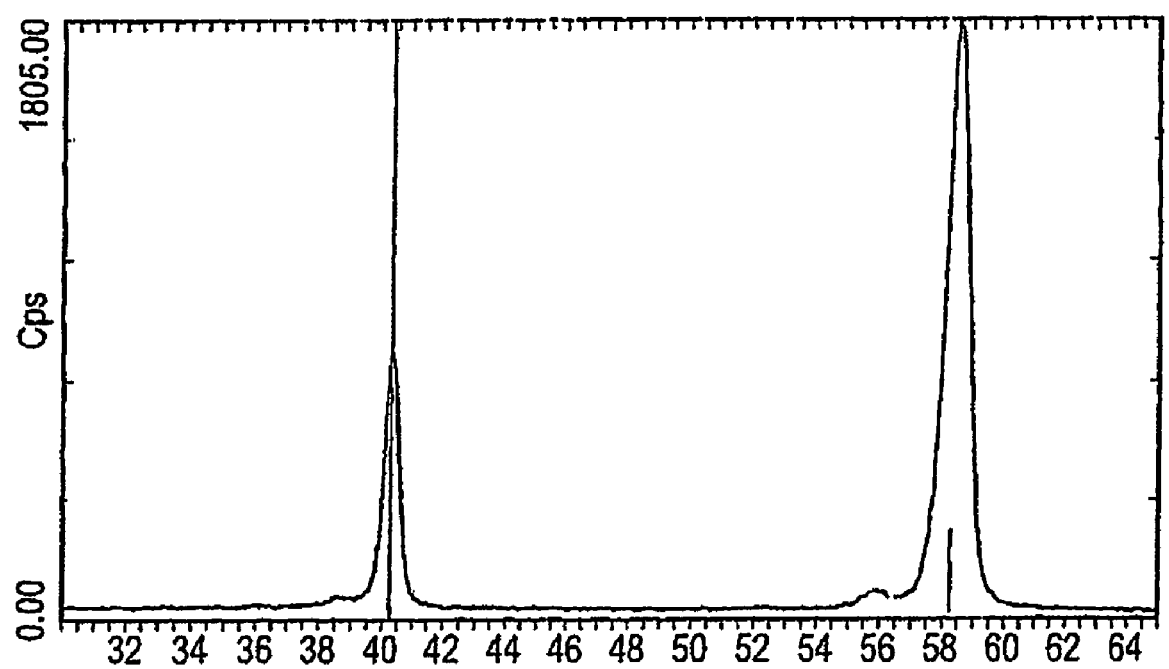
FIG. 1 shows an x-ray diffraction spectrum for a sample of a coating of a fast embodiment of the present invention.

FIG. 1 shows the XRD spectrum of a material of an embodiment of the present invention. It can be seen that the spectrum contains only lines characteristic of metal tungsten.

Figure 2:
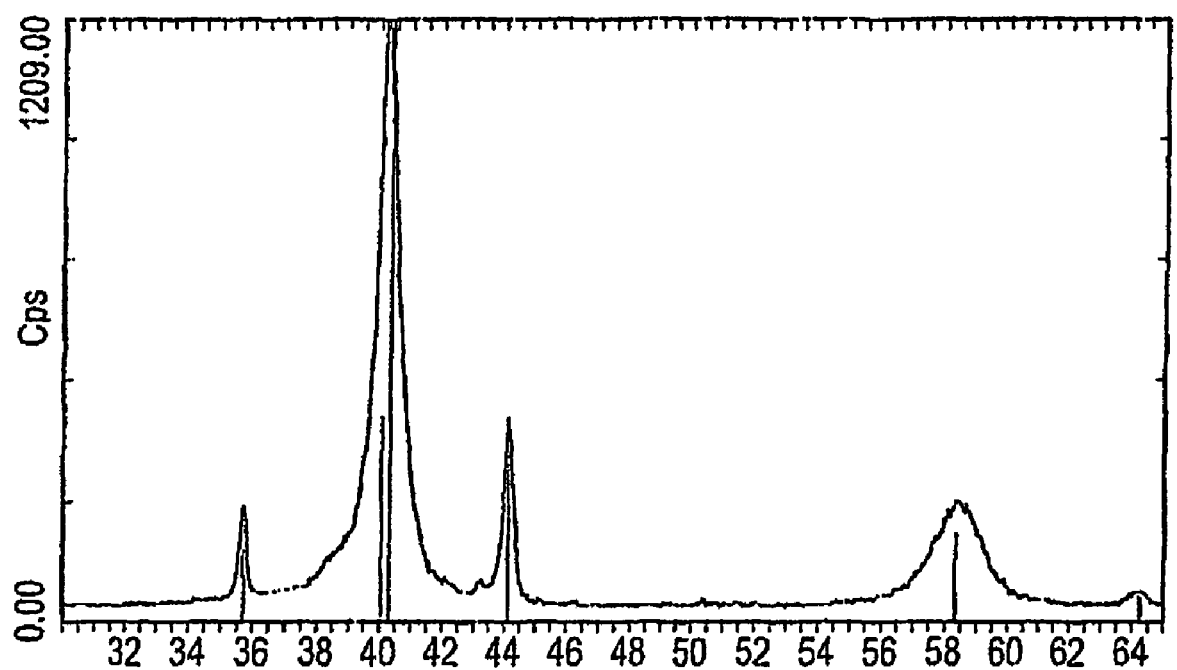
FIG. 2 shows an x-ray diffraction spectrum for a sample of a prior art coating.

FIG. 2 shows the XRD spectrum of sample 2 described in Example 4 below, which is similar to the material disclosed and claimed in U.S. Pat. No. 4,427,445. This spectrum shows lines typical for metal tungsten, as well as lines characteristic for tungsten carbide $W_3C$.

The comparison of these spectra shows the difference in the phase composition of the claimed new material and the previously known materials.

Further analytical methods such as hardness testing show that the material of embodiments of the present invention has a Vickers micro-hardness of 700 Hv to 2200 Hv, this being significantly higher than the hardness of metal tungsten at 430 Hv. This is thought to be due to the presence of nano-size precipitate particles of hard tungsten carbides with a particle size below 50 nm, preferably in amounts below 5 atomic percent. In this case, the presence of the hardening tungsten carbide precipitates will not be detected by XRD analysis.

These analytical results demonstrate that embodiments of the present invention comprise tungsten alloyed with tungsten carbide nanoparticles and optionally with fluorine in specific quantities and in a specific form. The alloying results in the formation of nano-crystals of tungsten carbides, optionally stabilized by fluorine, and dispersed in the metal tungsten matrix. In accordance with the election microscopy results shown in FIGS. 3 to 5, the size of the tungsten carbide nanocrystalline precipitates is below 50 nm, and in most cases below 10 nm.

The fact that the tungsten carbide precipitates are typically either tungsten monocarbide WC and/or tungsten semicarbide $W_2C$ is favourable for the mechanical properties of the material and its thermal stability. The brittle and thermally unstable tungsten subcarbide $W_3C$ phase present in the material described in U.S. Pat. No. 4,427,445 is not found in the material of preferred embodiments of the present invention.

The material of preferred embodiments of the present invention is a new previously unknown material comprising a metal tungsten matrix in which is dispersed or alloyed tungsten carbide nanoparticles, optionally also alloyed with fluorine.

The hardness and toughness of the alloyed tungsten can be controlled by varying the carbon content, for example the content of the tungsten carbide nanoparticles, which allows optimisation of the material properties to meet the requirements of a specific application.

In accordance with embodiments of present invention, metallic tungsten is alloyed with carbon or interspersed with tungsten carbide nanoparticles in amounts ranging from 0.01 wt % up to 0.97 wt %. With the increase of the alloying carbon content, the hardness of the material increases from 430 kg/mm$^2$ up to 2400 kg/mm$^2$, the results of some of the Examples being given below in Table 1. The hardness of the material does not vary linearly with the carbon content when the carbon content increases from 0.001 wt % up to 0.01 wt %, the micro-hardness increases from 430 up to 560 kg/mm$^2$. When the carbon content reaches 1.3 wt %, the hardness increases sharply up to 2200 kg/mm$^2$ and the tungsten carbide phase appears in XRD spectra. Tungsten alloyed with carbon in an amount of 1.3 wt % up to 1.85 wt % has enhanced hardness, but has a brittleness typical for harder tungsten carbides.

TABLE 1

| Hardness of tungsten alloyed with carbon depending on carbon content. | | | | | | | | |
|---|---|---|---|---|---|---|---|---|
| Carbon content [wt %] | 0.001 | 0.009 | 0.13 | 0.39 | 0.64 | 0.97 | 1.3 | 1.85 |
| Micro-hardness [Hv] | 430 | 560 | 1060 | 1200 | 1550 | 1980 | 2200 | 2400 |

The additional alloying of the carbon-tungsten compositions with fluorine enables the carbide constituent of the composition to be stabilised, this being achieved due to the high energy of the carbon-fluorine bond. By extensive experimentation, the present applicant has found that the stabilization effect is best achieved in a range of fluorine concentrations from 0.01 wt % up to 0.4 wt %. The double alloying with both carbon and fluorine provides an excellent combination of high hardness and satisfactory toughness of the material.

The material described above is produced by the method of Chemical Vapour Deposition on a heated substrate from a mixture of gases including tungsten hexafluoride, hydrogen, a carbon-containing gas and optionally an inert gas. The carbon-containing gas is thermally pre-activated by heating in a pre-heating chamber, advantageously to a temperature of 500-850° C., before introduction into a reaction chamber of a CVD reactor.

The process may include the following stages:
a) placing a cleaned substrate into a CVD reactor,
b) evacuating the reactor;
c) heating the substrate to a temperature of 350-700° C. and heating a carbon-containing gas pre-treatment chamber to 500-850° C.;
d) supplying gaseous tungsten hexafluoride, hydrogen and the preliminary thermally activated carbon-containing gas into the reactor;
e) holding the substrate in the gaseous medium for a time interval necessary for formation of a layer of tungsten alloyed with carbon and fluorine on the substrate.

The micro hardness and toughness of the material can be controlled and adjusted to meet predetermined requirements by controlling the process temperature, the carbon-containing gas pre-treatment temperature, the pressure in the reaction chamber (for example in a range from 0.1 up to 150 kPa), the ratio of the carbon-containing gas to hydrogen (for example in a range from 0.0001 up to 0.1, preferably from 0.001 to 0.7, but in some embodiments from 0.001 to 1.7), and the ratio of tungsten hexafluoride to hydrogen (for example in a range from 0.02 up to 0.02-0.5).

According to a further aspect of the present invention, the material can be produced as a coating on items and construction material substrates, while the items made from materials belonging to the group that includes iron, carbon steels, tool steels, stainless steels, cast iron, titanium alloys, titanium containing hard alloys and other materials which are not resistant to hydrogen fluoride may be coated prior to deposition with a sub-layer or primer layer made from materials that are chemically resistant to hydrogen fluoride, in particular nickel, cobalt, copper, silver, gold, platinum, iridium, tantalum, molybdenum, their alloys, compounds and mixtures, which may be deposited by methods of electrochemical or chemical deposition from aqueous solutions, electrolysis of molten salts, physical and chemical vapour deposition. Materials or items with an external layer containing more than 25% of nickel are preferred substrates for the carbon-alloyed tungsten coating, for example Invar®, Monel®, Nichrome® and Inconel®.

The adhesion of the material to construction materials can be improved by depositing another sub-layer of tungsten alloyed with fluorine only in an amount of 0.01-0.4 wt %. This sub-layer may have a thickness of 0.1-300 microns, while the external layer of the material may have a thickness of 0.5-300 microns, with the ratio between the thickness of the inner sublayer and the external layer ranging from 1:1 up to 1:600.

The proposed CVD process allows multi-layer compositions to be produces, which include hard yet brittle layers interspersed with relatively low hardness yet tough layers. The multi-layer coating can be produced as alternating layers of tungsten and tungsten alloyed with carbon (e.g. with tungsten carbide nanoparticles) in amounts from 0.01-0.97 wt % and optionally with fluorine in amounts 0.01-0.4 wt %.

Figure 5:
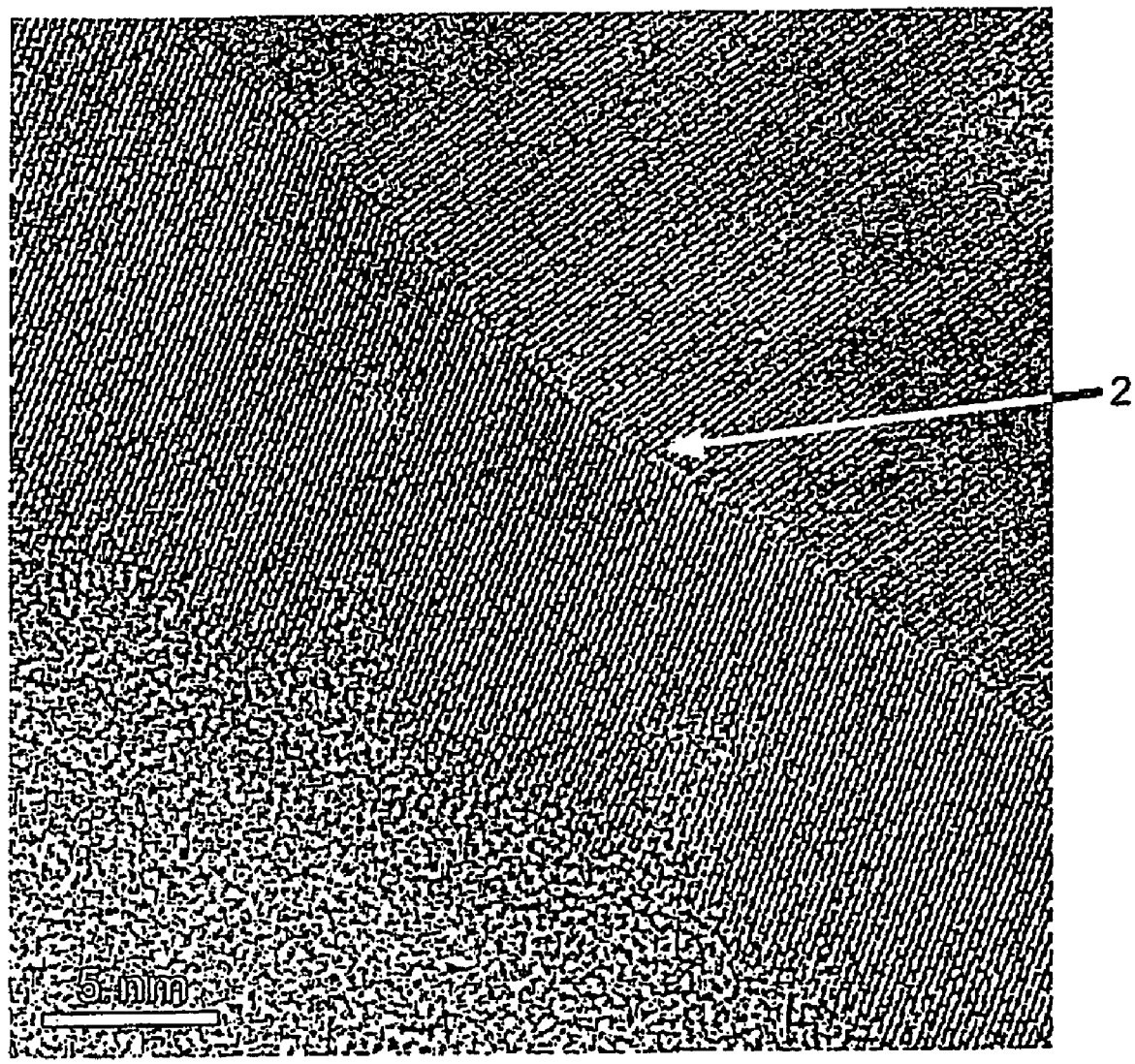

Another variant of the multi-layer coating consists of alternating layers of tungsten alloyed with carbon (e.g. tungsten carbide nanoparticles) in amounts from 0.01-0.97 wt % and optionally with fluorine in amounts from 0.01-0.4 wt % and layers of tungsten carbide alloyed with fluorine in amounts from 0.005-0.5 wt %, the tungsten carbide/fluorine layers being described in more detail in accordance EP 1 158 070. FIG. 5 shows a micro-photograph of the cross-section of such a multi-layer coating. By variation of the thicknesses and number of the layers, it is possible to adjust the hardness and toughness of the multi-layer composite coating as well as its thickness.

All the hereinbefore described types of coating are proposed for improving wear- and corrosion-resistance of wear parts, units and tools for metal processing by pressing or cutting, and also to improve the erosion-resistance of machinery units operating with pressurised gases and fluid and other pneumatic and hydraulic systems.

To analyse the material of embodiments of the present invention further, HRTEM analysis was performed. An alloyed tungsten sample N1089 was deposited on a copper substrate, the sample preparation being performed using a focussed ion beam technique with an FEI FIB 200 workstation.

Figure 3:
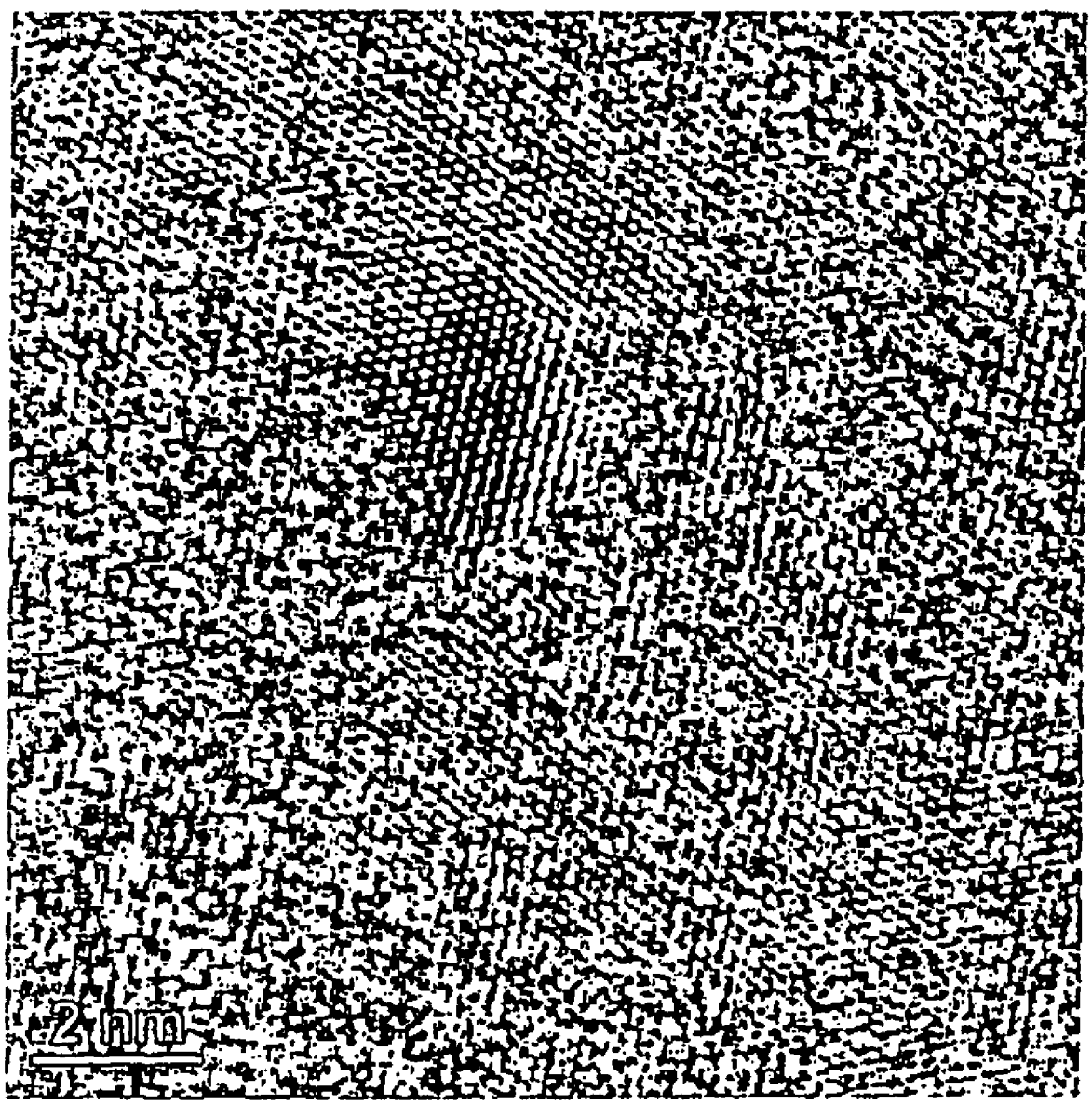
FIGS. 3 to 5 show high resolution transmission electron microscopy (HRTEM) images of materials of embodiments of the present invention.

An HRTEM micrograph taken with a JEOL 3000F instrument is shown in FIG. 3. A dark spot in the upper-central past of the image is a precipitate with dimensions between 2 and 4 nm. The inter-atomic distances (1.49 and 1.76 Å) directly measured from the precipitate region are different from those of metal tungsten and are matched best to the lattice constants of $W_2C$ ((110) plane—1.49 Å and (102) plane—1.74 Å).

Figure 4:
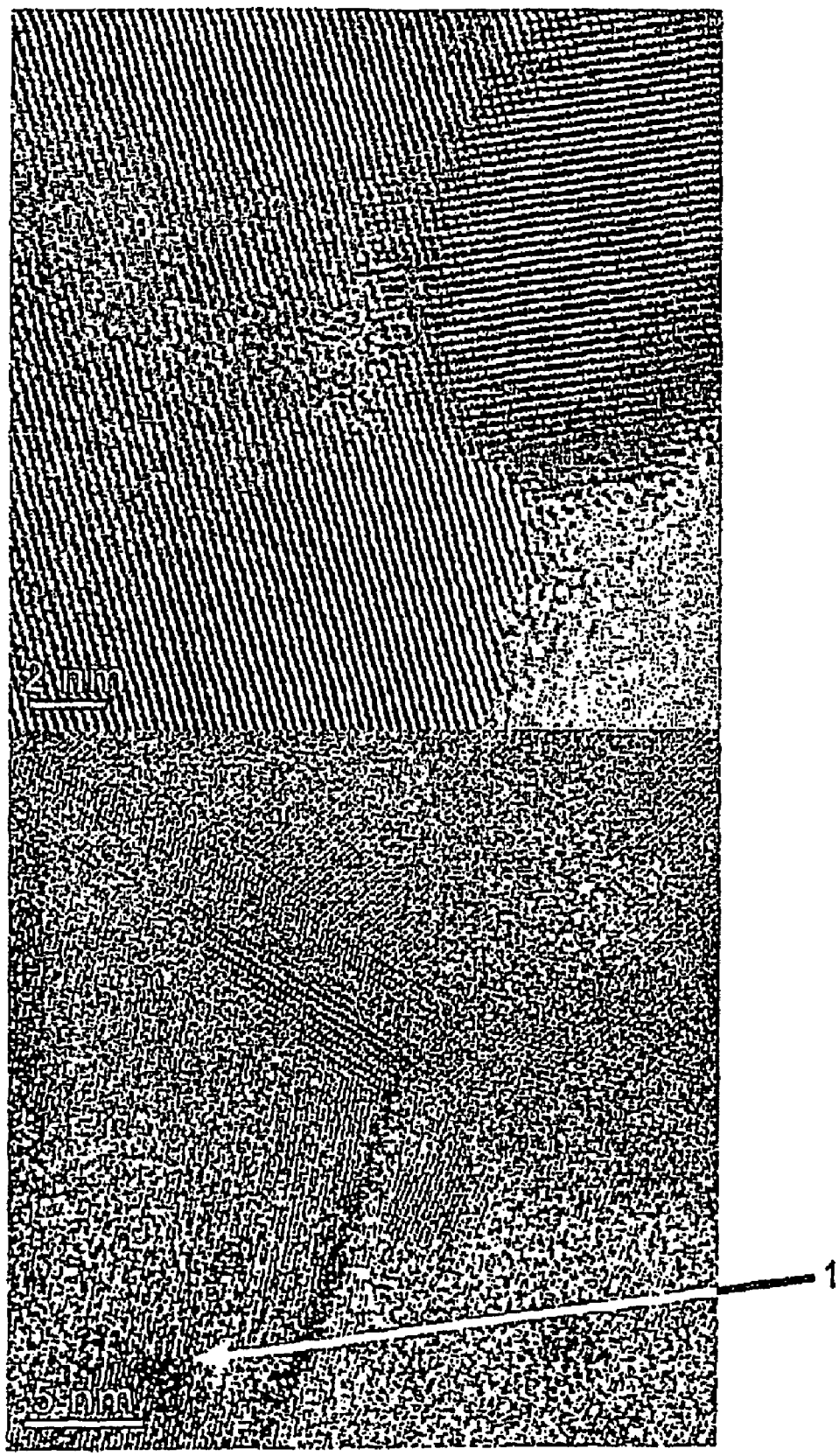

FIG. 4 is an HRTEM micrograph showing another tungsten carbide precipitate 1 with size approximately 2 nm.

FIG. 5 is an HRTEM image of a grain boundary 2 in an alloyed tungsten sample N186. Only minimal contrast was observed on this grain boundary, this being typical for observations of other samples and indicating that the tungsten carbide precipitates are not concentrated on the grain boundaries but more regularly formed within a grain. This is favourable for the mechanical properties of the material as the formation of a harder phase on the grain boundaries can increase brittleness.

Similar observations were made by a Philips 400 T transmission electron microscope equipped with a Link 860 X-ray micro-probe. Precipitates of tungsten carbide with sizes varying from 8 nm up to 50 nm were found in various samples of the material.

Figure 6:
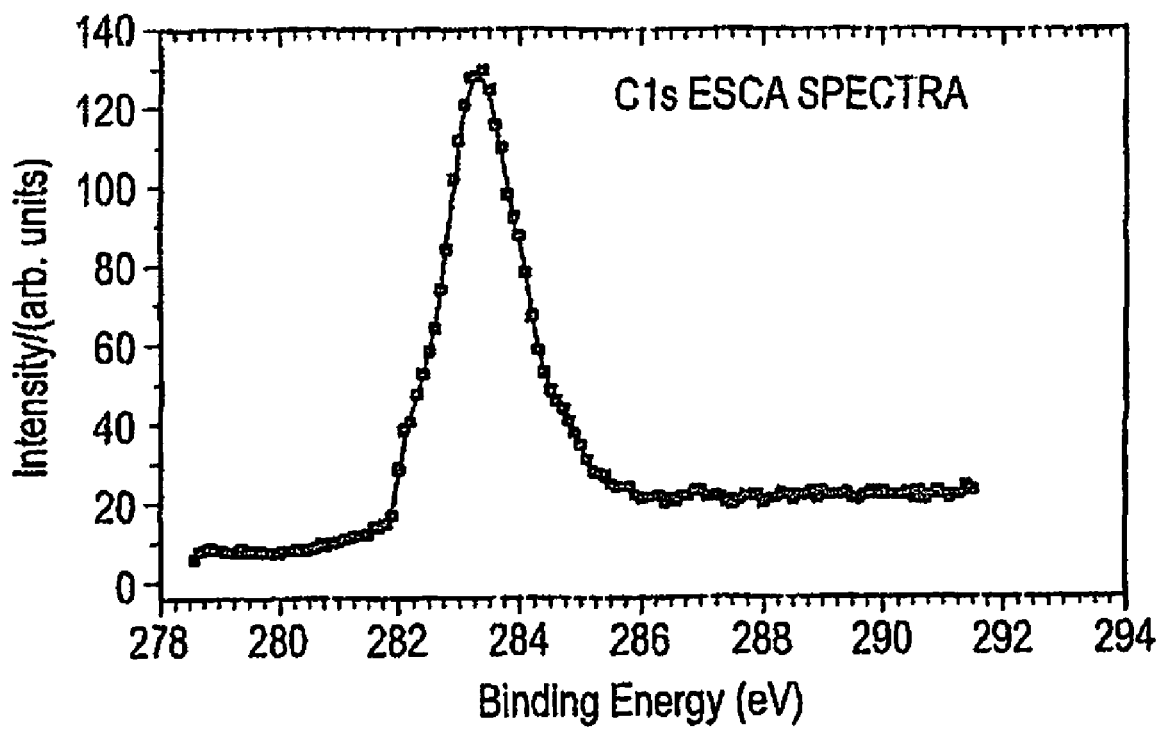
FIGS. 6a and 6b show electron spectroscopy for chemical analysis (ESCA)/X-ray photoelectron spectroscopy (XPS) spectra for materials of embodiments of the present invention.
Figure 6:
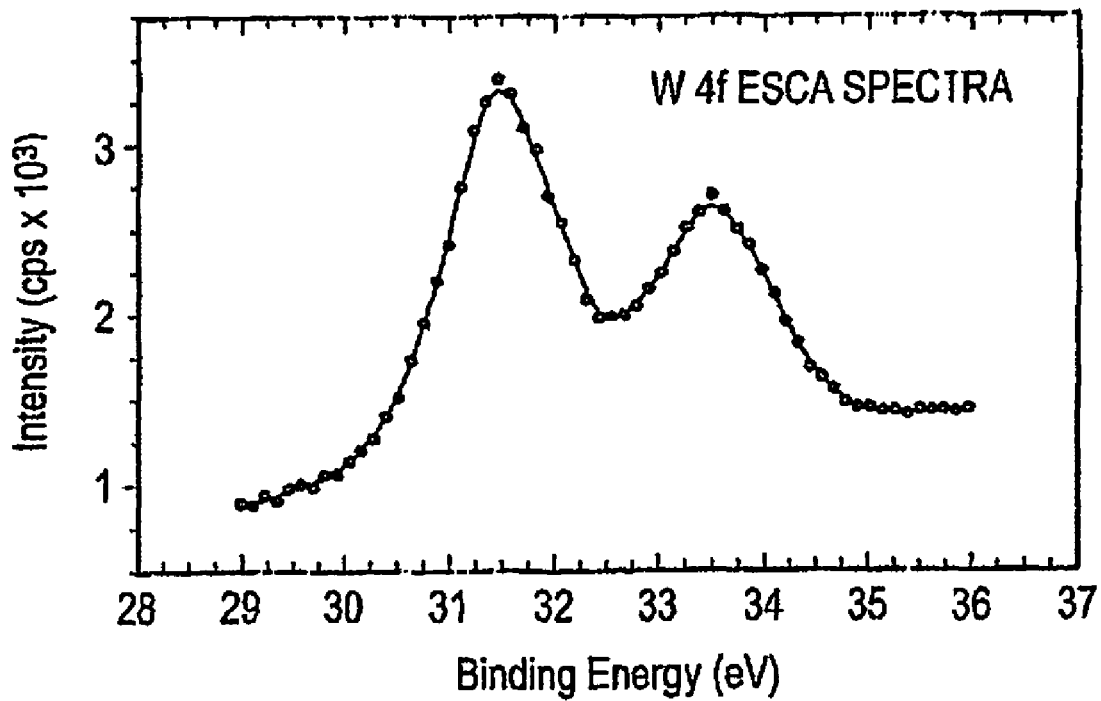

FIGS. 6a and 6b show the ESCA spectra of an alloyed tungsten sample 365. The sample was scribed in a vacuum to a depth of 2-3 μm to expose a fresh material volume free from contamination. An ESCA MkII spectrometer equipped with a CLAM 100 detector was used for analysis, the data collection and processing being performed using a VGX DATA 900 software package. The energy scale was calibrated on the basis of gold peak Au 4f7 made by flash-evaporation, the binding energy of this peak being measured at 83.8 eV. The positions of the peaks were measured with an accuracy of +/−0.1 eV. The main detected lines from the alloyed tungsten sample are due to tungsten and carbon. The tungsten peaks W 4f7 and W 4f5 were found to be in good accordance with the published data for metal tungsten, which additionally confirmed the instrument calibration. The carbon line C 1s was detected at a binding energy of 283.5 eV, which is significantly lower than the characteristic binding energy of the level C 1s of carbon in typical surface contaminations like organics or free carbon (284.6 and 285 eV respectively). This shift of the carbon peak towards a lower binding energy shows that the carbon present in the sample is in a chemically bonded foam as tungsten carbide.

Figure 7A:
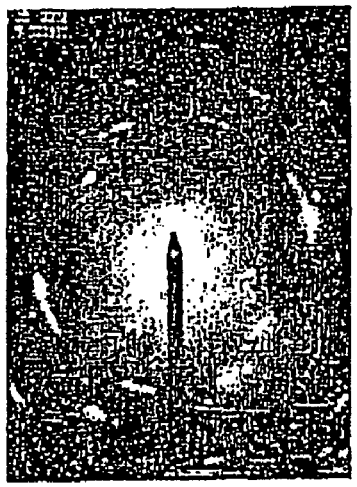
FIGS. 7a to 7c show electron diffraction images of materials of embodiments of the present invention.
Figure 7B:
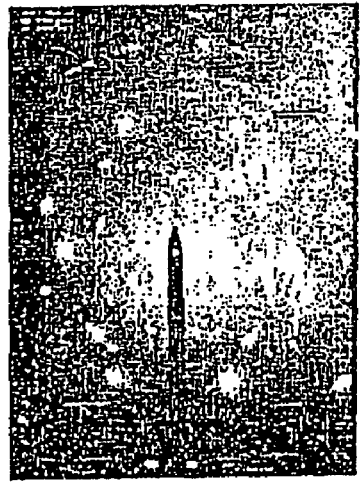
Figure 7C:
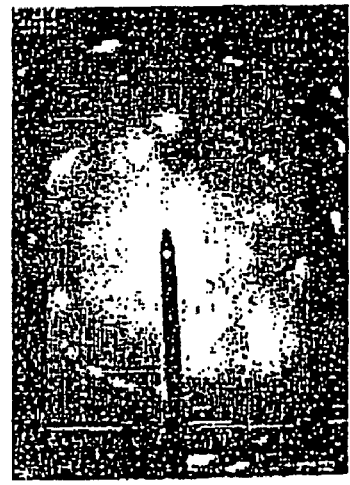

Electron diffraction images produced by analysis of the sample under a transmission electron microscope are shown in FIGS. 7a to 7c. This method of analysis does enable the presence of tungsten carbides to be demonstrated:

FIG. 7a is the diffraction pattern corresponding to the crystalline lattice of $W_2C$ (angle between the reflexes 100 (d=4.49 Å), 110 (d=2.59 Å) and 010 (d=4.49 Å) is 60°).

FIG. 7b is the diffraction pattern corresponding to $WC_{(1-x)}$ (angle between the reflexes 013 (d=4.01 Å), 026 and 103 is 44°);

FIG. 7c corresponds to the prohibited reflexes of tungsten 100 (d=3.16 Å) and W₂C (d=4.63 Å).

Electron diffraction does identify the presence of tungsten carbides, and this can be explained by their fine crystalline structure which cannot be analysed using x-ray diffraction. The nano-crystalline tungsten carbide precipitates increase the material hardness.

EXAMPLES

Although the use of tungsten alloyed with tungsten carbide nanoparticles (obtained according to the proposed invention) as a bulk construction material is not excluded, it is currently preferred to deposit the novel tungsten material on conventional construction materials and items made thereof in the form of wear-resistant coatings. This is why the Examples presented below illustrate the invention specifically in the cases of deposition of alloyed tungsten on the substrates as coatings. However, these examples do not limit or restrict the invention because, for example, it is possible to obtain other combinations of tungsten alloyed with tungsten carbide(s) and/or carbon having desirable properties for a particular application by means of the processes of the present invention with an appropriate variation of the operating parameters. It is therefore intended to cover in the appended claims all such changes and modifications that are within the scope of this invention.

Example 1

A sample of Inconel-718® is loaded into a CVD reactor and kept at a temperature of 620° C. in a gaseous medium of $WF_6$ and hydrogen at a ratio of 1:20 for 10 minutes and then in a gaseous medium of $WF_6$, hydrogen and propane ($C_3H_8$) with a ratio between $WF_6$ and $H_2$ of 13:100 and $C_3H_8$ to $H_2$ of 0.007 at a pressure of 2 kPa for 120 minutes. Prior to use, the propane is thermally pre-activated to a temperature of 550° C. As a result, a material is produced with a base made of Inconel-718® having composite coatings consisting of an innermost layer of tungsten 3 microns thick, and an external layer of tungsten alloyed with tungsten carbide nanoparticles in an amount 0.009 wt % and 45 microns thick. The micro-hardness of the external layer is 560 HV.

Example 2

A sample of tool steel D2 precoated with a 3 micron thick nickel layer by an electrochemical process is loaded into the CVD reactor and kept at a temperature of 520° C. in a gaseous medium of $WF_6$ and hydrogen in a ratio of 13:100 for 10 minutes and then in a gaseous medium of $WF_6$, hydrogen and propane ($C_3H_8$) with a ratio between $WF_6$ and $H_2$ of 13:100 and $C_3H_8$ to $H_2$ of 0.045 for 120 minutes. The propane is thermally pre-activated to a temperature of 695° C. and the pressure of the reaction mixture is kept at 0.1 kPa. As a result, a material is produced with a base made of tool steel D2 having a sub-layer of nickel and a composite coating consisting of an innermost layer of tungsten 3 microns thick and an external layer of 36 microns thick tungsten alloyed with tungsten carbide nanoparticles in an amount 0.13 wt %. The micro-hardness of the external layer is 1060 HV.

Example 3

A sample of stainless steel 316 pre-coated with 1 micron thick electroless nickel is loaded into the CVD reactor and kept at a temperature of 470° C. in a gaseous medium of $WF_6$ and hydrogen in a ratio of 7:100 for 50 minutes and then in $WF_6$, hydrogen and propane ($C_3H_8$) with a ratio between $WF_6$ and $H_2$ of 7:100 and $C_3H_8$ to $H_2$ of 0.05 for 115 minutes. The propane is thermally pre-activated to a temperature of 700° C. and the pressure of the reaction mixture is kept at 0.2 kPa. As a result, a material is produced with a base made of stainless steel 316 having a 1 micron sub-layer of nickel and a composite coating consisting of an innermost layer of tungsten 18 microns thick, and an external layer of 37 microns thick tungsten alloyed with tungsten carbide nanoparticles in an amount 0.39 wt %. The micro-hardness of the external layer is 1200 HV.

Example 4

A sample of copper is loaded into the CVD reactor and kept at a temperature of 520° C. in $WF_6$ and hydrogen in a ratio of 8:100 for 10 minutes and then in $WF_6$, hydrogen and propane ($C_3H_8$) with a ratio between $WF_6$ and $H_2$ of 8:100 and $C_3H_8$ to $H_2$ of 0.135 for 110 minutes. The propane is thermally pre-activated to a temperature of 713° C. and the pressure of the reaction mixture is kept at 0.1 kPa. As a result, a material is produced with a base made of copper and a composite coating consisting of an innermost layer of tungsten 2 microns thick, and an external layer of 46 microns thick tungsten alloyed with tungsten carbide nanoparticles in an amount 0.64 wt %. The micro-hardness of the external layer is 1550 HV.

This coating (Sample 1) has been analysed using x-ray diffraction analysis, the resulting spectrum being shown in FIG. 1. The spectrum of this sample has only lines characteristic fox metallic tungsten, but bas no lines typical for tungsten carbide.

For comparative illustration, FIG. 2 shows an x-ray diffraction spectrum of another sample (Sample 2) which has both tines of tungsten and of tungsten carbide. This sample (Sample 2) was prepared in the following way: a plate of carbon steel 4140 precoated with 5 microns thick nickel by electrochemical process is loaded into the CVD reactor and kept at a temperature of 500° C. in $WF_6$ and hydrogen at a ratio of 75:1000 for 15 minutes and then in $WF_6$, hydrogen and propane ($C_3H_8$) with a ratio between $WF_6$ and $H_2$ of 75:1000 and $C_3H_8$ to $H_2$ of 0.1 for 100 minutes. The propane is thermally pre-activated to a temperature of 726° C. and the pressure of the reaction mixture is kept at 0.2 kPa. As a result, a material is produced with a base made of carbon steel 4140 having a sub-layer of nickel and a composite coating consisting of an innermost layer of tungsten 3 microns thick, and an external layer of 36 microns thick tungsten mixed with tungsten semicarbide, having a carbon content of 1.75 wt %. The micro hardness of the external layer is 2350 HV.

Sample 1 has also been analysed using the electron beam diffraction method under a transmission electron microscope, the resulting images being shown in FIG. 7. This method of analysis does enable the presence of tungsten carbides to be demonstrated.

If the results of the various analyses of this sample are considered together, the x-ray diffraction shows only the presence of metal tungsten, although the micro-hardness of this sample at the level of 1550 Hv is much higher than the hardness of metal tungsten, which is typically at the level of 430 Hv. Electron diffraction does identify the presence of tungsten carbides, and this can be explained by their fine crystalline structure which cannot be analysed using x-ray diffraction. The presence of these nano-crystalline tungsten carbides explains the high hardness of this material.

These measurements and analysis results are typical for this form of tungsten alloyed with carbon and fluorine which is the subject of this invention.

Example 5

A sample of tool steel M2 pre-coated with 1 micron thick electroless nickel is loaded into the CVD reactor and kept at a temperature of 500° C. in $WF_6$ and hydrogen at a ratio of 55:1000 for 10 minutes and then in $WF_6$, hydrogen and propane ($C_3H_8$) with a ratio between $WF_6$ and $H_2$ of 55:1000 and $C_3H_8$ to $H_2$ of 0.075 for 90 minutes. The propane is thermally pre-activated to a temperature of 718° C. and the pressure of the reaction mixture is kept at 0.2 kPa. As a result, a material is produced with a base made of tool steel M2 having a 1 micron sub-layer of nickel and a composite coating consisting of an innermost layer of tungsten 2 microns thick, and an external layer of 25 microns thick tungsten alloyed with tungsten carbide nanoparticles in an amount 0.97 wt %. The micro-hardness of the external layer is 1980 HV.

Example 6

A sample of Monel® 400 is loaded into the CVD reactor and kept at a temperature of 450° C. in $WF_6$ and hydrogen at a ratio of 1:4 for 40 minutes and then in $WF_6$, hydrogen and propane ($C_3H_8$) with a ratio between $WF_6$ and $H_2$ of 55:1000 and $C_3H_8$ to $H_2$ of 0.075 for 70 minutes. The propane is thermally pre-activated to a temperature of 728° C. and the pressure of the reaction mixture is kept at 0.2 kPa. As a result, a material is produced with a base made of Monel® 400 and a composite coating consisting of an innermost layer of tungsten 8 microns thick, and an external layer of 15 microns thick tungsten alloyed with tungsten carbide nanoparticles in an amount 1.22 wt %. The micro-hardness of the external layer is 2100 HV.

Example 7

A sample of tool steel D2 pre-coated with 5 microns thick nickel by an electrochemical process is loaded into the CVD reactor and kept at a temperature of 510° C. in $WF_6$ and hydrogen at a ratio of 8:100 for 3 minutes (stage A) and then in $WF_6$, hydrogen and propane ($C_3H_8$) with a ratio between $WF_6$ and $H_2$ of 8:100 and $C_3H_8$ to $H_2$ of 0.6 for 9 minutes (stage B). The propane is thermally pre-activated to a temperature of 730° C. and the pressure of the reaction mixture is maintained at 0-3 kPa.

The stages A and B are repeated in alternating order 10 times.

As a result, a material is produced with a base made of tool steel D2 having a sub-layer of nickel and a composite coating consisting of 10 pairs of alternating layers of i) tungsten each layer 1 micron thick and ii) tungsten alloyed with tungsten carbide nanoparticles in an amount 1.12 wt % 3 microns thick. The overall thickness of the multilayer coating is 31 microns with the ratio between the thicknesses of each layer i) and ii) being 1:3. The average micro-hardness of the coating is 1680 HV.

Example 8

A sample of cemented carbide of VK-15 grade (15% cobalt) is loaded into the CVD reactor and kept at a temperature of 610° C. in $WF_6$ and hydrogen at a ratio of 2:10 for 7 minutes (stage A) and then in $WF_6$, hydrogen and propane ($C_3H_8$) with a ratio between $WF_6$ and $H_2$ of 2:10 and $C_3H_8$ to $H_2$ of 0.5 for 15 minutes (stage B). The propane is thermally pre-activated to a temperature of 735° C. and the pressure of the reaction mixture is kept at 0.1 kPa.

The stages A and B are repeated in alternating order 5 times.

As a result, a material is produced with a base made of cemented carbide and a composite coating consisting of 5 pairs of alternating layers of i) tungsten each layer 3 microns thick, and ii) tungsten alloyed with tungsten carbide nanoparticles in an amount 1.39 wt % 5 microns thick. The overall thickness of the multi-layer coating is 40 microns with the ratio between the thicknesses of layers i) and ii) being 1:3. The average micro-hardness of the coating is 1500 HV.

Example 9

A sample of stainless steel 321 pre-coated with 5 microns thick nickel by an electrochemical process is loaded into the CVD reactor and kept at a temperature of 530° C. in $WF_6$, hydrogen and propane with a ratio between $WF_6$ and $H_2$ of 8:100 and $C_3H_8$ to $H_2$ of 0.15 for 4 minutes (stage A) and then in $WF_6$, hydrogen and propane ($C_3H_8$) with a ratio between $WF_6$ and $H_2$ of 3:100 and $C_3H_8$ to $H_2$ of 4.50 for 12 minutes (stage B). The propane is thermally pre-activated to a temperature of 731° C., and the pressure of the reaction me is kept at 2 kPa.

The stages A and B are repeated in alternating order 7 times.

As a result, a material is produced with a base made of stainless steel 321 having a sub-layer of nickel and a composite coating consisting of 7 pairs of alternating layers of i) tungsten alloyed with tungsten carbide nanoparticles each layer 2 microns thick, and ii) tungsten carbide $W_2C$ 2 microns thick. The overall thickness of the multi-layer coating is 28 microns with the ratio between layers i) and ii) being 1:1. The average micro-hardness of the coating is 2570 HV.

The preferred features of the invention are applicable to all aspects of the invention and may be used in any possible combination.

Throughout the description and claims of this specification, the words "comprise" and "contain" and variations of the words, for example "comprising" and "comprises", mean "including but not limited to", and are not intended to (and do not) exclude other components, integers, moieties, additives or steps.

The invention claimed is:

1. A wear-resistant, erosion-resistant and chemically-resistant material comprising:
   metallic tungsten alloyed with carbon, the carbon being present in an amount of 0.01 wt % up to 0.97 wt % of the total weight, wherein the metallic tungsten is interdispersed with tungsten carbide nanoparticles having a particle size not greater than 50 nanometers, and
   wherein the tungsten carbide nanoparticles comprise tungsten monocarbide WC, tungsten semicarbide $W_2C$, or a mixture of tungsten monocarbide WC and tungsten semicarbide $W_2C$.

2. A material as claimed in claim 1, additionally alloyed with fluorine, the fluorine being present in an amount of 0.001 wt % up to 0.4 wt % of the total weight.

3. A material as claimed in claim 1, having a micro-hardness from 700 Hv up to 2000 Hv.

4. A coating, comprising:
   an internal layer consisting of tungsten deposited on a substrate; and
   an external layer deposited on said internal layer and containing a material as claimed in claim 1.

5. A coating as claimed in claim 4, characterised in that the internal layer has a thickness of 0.5-300 μm and in that the outer layer has a thickness of 0.5-300 μm, with a ratio of thickness of the internal layer to the thickness of the external layer ranging from 1:1 to 1:600.

6. A process for producing a material as claimed in claim 1 by chemical vapour deposition on a heated substrate using a mixture of gases including tungsten hexafluoride, hydrogen, a carbon-containing gas wherein the carbon-containing gas is thermally activated beforehand by heating to a temperature of 500-850° C.

7. A process according to claim 6, wherein the carbon-containing gas is propane.

8. A process according to claim 6, wherein the process is performed at a pressure of 0.1–150 kPa, a substrate temperature of 350-700° C., a volumetric ratio of carbon-containing gas to hydrogen of 0.001-0.7 and a volumetric ratio of tungsten hexafluoride to hydrogen of 0.02-0.5.

9. A process for deposition on a substrate of a coating consisting of an internal layer of tungsten and an external layer containing a material as claimed in claim 1 the process including the following stages:
 a) placing the substrate in a chemical vapour deposition reactor;
 b) evacuating the reactor;
 c) heating the substrate;
 d) supplying a gaseous medium including tungsten hexafluoride and hydrogen to the reactor;
 e) retaining the substrate in the gaseous medium until a tungsten layer is formed on the substrate;
 f) supplying a gaseous medium including tungsten hexafluoride, hydrogen and a previously thermally activated carbon-containing gas to the reactor;
 g) retaining the substrate in the gaseous medium formed at stage (f) until a layer of tungsten alloyed with carbon and fluorine is formed on the layer of tungsten formed at stage e).

10. A process according to claim 9, wherein a material or item to be coated is first provided with a primer coating that is chemically resistant to hydrogen fluoride.

11. A process according to claim 9, wherein the material or item to be coated is made of iron, carbon steel, stainless steel, cast iron, titanium alloy or cemented carbide containing titanium.

12. A process according to claim 9, wherein the primer coating consists of nickel, cobalt, copper, silver, gold, platinum, iridium, tantalum, molybdenum and alloys, compounds and mixtures thereof.

13. A process according to claim 10, wherein the primer coating is applied by way of electrochemical or chemical deposition from aqueous solutions, electrolysis of melts or physical or chemical vapour deposition.

14. A process according to claim 9, wherein the coating is deposited onto friction assemblies.

15. A process according to claim 9, wherein the coating is deposited onto a forming tool used for processing materials by means of pressing.

16. A process according to claim 9, wherein the coating is deposited onto units of machines and mechanisms operating with compressed gases, liquids or units of other pneumatic or hydraulic systems.

17. A material comprising a construction material having a substrate layer coated with a material or a coating as claimed in claim 1.

18. A material as claimed in claim 17, wherein at least the substrate layer of the construction material is made of an alloy having a nickel content of at least 25 wt %.

19. A multilayer coating comprising layers of tungsten alternating with layers of a material as claimed in claim 1.

20. A multilayer coating as claimed in claim 19, wherein the individual layers each have a thickness from 0.5 to 10 μm, and wherein a ratio of the thicknesses of the alternating layers ranges from 1:1 to 1:5.

21. A process for the deposition of a multilayer coating on a substrate, the multilayer coating consisting of alternating layers of tungsten and layers containing tungsten alloyed with carbon, the process including the following stages:
 a) placing the substrate in a chemical vapour deposition reactor;
 b) evacuating the reactor;
 c) heating the substrate;
 d) supplying a gaseous medium including tungsten hexafluoride and hydrogen to the reactor;
 e) retaining the substrate in the gaseous medium until a tungsten layer is formed on the substrate;
 f) supplying a gaseous medium including tungsten hexafluoride, hydrogen and a previously thermally activated carbon-containing gas to the reactor;
 g) retaining the substrate in the gaseous medium formed at stage (f) until a layer of tungsten alloyed with carbon, wherein the carbon is present in an amount of 0.01 wt % up to 0.97 wt % of the total weight, is formed on the layer of tungsten formed at stage e);
 h) repeating stages d) to g) one or more times in order to form the multilayer coating.

22. A process according to claim 21, wherein the process is performed at a pressure of 0.1–150 kPa, a substrate temperature of 350-700° C., a ratio of carbon-containing gas to hydrogen in step f) of 0.001 to 0.7 and a ratio of tungsten hexafluoride to hydrogen of 0.02-0.5.

23. A multilayer coating comprising layers of a material as claimed in claim 4, alternating with layers containing tungsten carbide alloyed with fluorine in amounts ranging from 0.005 to 0.5 wt % of the weight of the respective layer.

24. Multilayer coating as claimed in claim 23, wherein the individual layers each have a thickness ranging from 0.5 to 10 μm, and wherein a ratio of the thicknesses of the alternating layers ranges from 1:1 to 1:5.

25. A process for the deposition of a multilayer coating on a substrate, the multilayer coating consisting of alternating layers of tungsten alloyed with carbon and with fluorine, and layers containing tungsten carbide alloyed with fluorine, the process including the following stages:
 a) placing the substrate in a chemical vapour deposition reactor;
 b) evacuating the reactor;
 c) heating the substrate;
 d) supplying a gaseous medium including tungsten hexafluoride, hydrogen and a previously thermally activated carbon-containing gas to the reactor;
 e) retaining the substrate in the gaseous medium until a layer of metallic tungsten alloyed with carbon and with fluorine is formed on the substrate wherein the carbon is present in an amount of 0.01 wt % up to 0.97 wt % of the total weight;
 f) supplying an additional amount of the previously thermally activated carbon-containing gas to the reactor;
 g) retaining the substrate in the gaseous medium formed at stage (f) until a layer containing tungsten carbide alloyed with fluorine is formed on the layer formed at stage e);
 h) repeating stages (d) to (g) one or more times in order to form the multilayer coating.

26. A process according to claim 25, wherein the process is performed at a reactor pressure of 0.1–150 kPa, a substrate temperature of 350-700° C., a ratio of carbon-containing gas to hydrogen in steps d) and f) of 0.001-1.7 and a ratio of tungsten hexafluoride to hydrogen of 0.02-0.5.

27. A process according to claim 25, wherein a material or item to be coated is first provided with a primer coating that is chemically resistant to hydrogen fluoride.

28. A process according to claim 25, wherein the material or item to be coated is made of iron, carbon steel, stainless steel, cast iron, titanium alloy or cemented carbide containing titanium.

29. A process according to claim 27, wherein the primer coating consists of nickel, cobalt, copper, silver, gold, platinum, iridium, tantalum, molybdenum and alloys, compounds and mixtures thereof.

30. A process according to claim 27, wherein the primer coating is applied by way of electrochemical or chemical deposition from aqueous solutions, electrolysis of melts or physical or chemical vapour deposition.

31. A process according to claim 27, wherein the coating is deposited onto friction assemblies.

32. A process according to claim 27, wherein the coating is deposited onto a forming tool used for processing materials by means of pressing.

33. A process according to claim 27, wherein the coating is deposited onto units of machines and mechanisms operating with compressed gases and liquids or units of other pneumatic or hydraulic systems.

34. A construction material comprising:
a substrate; and
a multilayer coating deposited on the substrate, consisting layers of tungsten alloyed with fluorine alternating with layers of a material as claimed in claim 1.

35. A construction material comprising:
a substrate;
a multi-layer coating as claimed in claim 23 deposited on the substrate.

36. A material as claimed in claim 1, comprising a matrix of metallic tungsten with dispersed tungsten carbide nanoparticles having a particle size not greater than 10 nanometers.

37. A process for producing a material as claimed in claim 1 by chemical vapour deposition on a heated substrate using a mixture of gases including tungsten hexafluoride, hydrogen, a carbon-containing gas and an inert gas, wherein the carbon-containing gas is thermally activated beforehand by heating to a temperature of 500-850° C.

* * * * *